United States Patent [19]

Long

[11] Patent Number: 5,241,312
[45] Date of Patent: Aug. 31, 1993

[54] HIGH RESOLUTION ANALOG TO DIGITAL CONVERTER

[76] Inventor: Christopher R. Long, 4901 Woodcroft Cir., Greensboro, N.C. 27407

[21] Appl. No.: 848,100

[22] Filed: Mar. 9, 1992

[51] Int. Cl.⁵ .......................................... H03M 1/40
[52] U.S. Cl. ................................ 341/163; 341/127
[58] Field of Search ............... 341/127, 156, 161, 162, 341/163

[56] References Cited

U.S. PATENT DOCUMENTS

| | | | |
|---|---|---|---|
| 3,581,304 | 5/1971 | Paradise et al. | 340/347 |
| 3,646,548 | 2/1972 | Van Doren | 340/347 |
| 3,956,746 | 5/1976 | Lisle et al. | 340/347 |
| 4,194,185 | 3/1980 | Wilson | 340/347 |
| 4,218,675 | 8/1980 | Shaw et al. | 340/347 |
| 4,410,880 | 10/1983 | Zaborowski | 341/127 |
| 4,471,340 | 9/1984 | Lewis | 341/127 |
| 4,849,759 | 7/1989 | Hughes | 341/156 |
| 4,875,048 | 10/1989 | Shimizu et al. | 341/156 |
| 4,897,658 | 1/1990 | Fujii et al. | 341/161 |
| 4,973,976 | 11/1990 | Lee et al. | 341/141 |
| 5,010,339 | 4/1991 | Giangano et al. | 341/164 |
| 5,017,920 | 5/1991 | French | 341/163 |
| 5,070,332 | 12/1991 | Kaller et al. | 341/156 |
| 5,105,194 | 4/1992 | Mizunoue | 341/156 |

Primary Examiner—Marc S. Hoff

[57] ABSTRACT

A high resolution analog to digital converter is provided which operates at a relatively high speed. The converter will operate in either a bipolar or unipolar mode and the bipolar mode includes a signal/sign transposer. A sample/holding circuit temporarily holds the analog input at its sample level. The device also includes analog to digital converter, a reference selector, a reference source, a digital/analog converter, a subtracter for conversion voltages, a plurality of latches, a buffer and timing/control circuitry.

15 Claims, 9 Drawing Sheets

HIGH RESOLUTION ANALOG TO DIGITAL CONVERTER

BACKGROUND OF THE INVENTION

1. Field of Invention

The present invention relates to an Analog to Digital Converter (ADC) and particularly to a parallel ADC which will provide a means of achieving a high resolution at a relatively high speed.

2. Description of Prior Art

Prior analog to digital converters such as successive approximation or ramp can provide a high resolution. The techniques implemented by these ADC's provides a means of integrating them onto a single chip. This single chip solution enables designers to concentrate on more complex parts of their circuit. At that same time it provides a way of using less space on a PC board, improves the reliability of operation, and consumes less energy than a multi component ADC. The ramp ADC can provide a high resolution, however for each bit it uses it takes $2^n$ (n=number of bits) clock pulses to convert each bit (i.e. 8 bits=256 clock pulses). This in effect means that a ramp ADC has a small bandwidth in respect to the resolution and therefore its uses are limited to analog signals which require low conversion rates such as a cruise control circuit in a car. The successive approximation ADC on the other hand provides a high resolution with the cost for each bit being one clock pulse per bit (i.e. 8 bits=8 clock pulses). This in effect means a successive approximation ADC has a larger bandwidth than a ramp ADC and can provide a much higher acquisition rate, which makes it a great ADC for conversions such as HiFi Audio Signals. Even though present technology successive approximation single chip ADC have a typical maximum conversions frequency of 500 KHz (time=2 μs), this speed is not quite fast enough for conversions such as video. For the purpose of very high speed conversion such as video and other high frequency signals the Flash ADC (this includes Half Flash ADC) is the only existing type of ADC at the present time that can achieve these multi bit conversions at such speeds. The Flash ADC achieves its high performance through circuit complexity. That is it requires $2^n-1$ comparators and decoders to produce a Flash ADC of n bits (i.e. 16 bits requires 65,535 comparators and decoders). This poses a problem on present technology of how many comparators and decoders can fit into a small area on a chip, how the addition of each bit increases the power dissipation, how to deal with increase in temperature due to the power dissipation and the cost of production. For these reasons the Half Flash ADC was developed, it provides a solution to reducing the complexity of the circuitry used in a Flash ADC yet provides an acceptable acquisition rate for high speed conversions (the acquisition rate is approximately half the speed of the Flash ADC used in the Half Flash ADC). The Half Flash ADC achieves its performance at the cost of $2*(2^{n/2}-1)$ comparators and decoders to produce a Half Flash ADC of n bits (i.e. 16 bits requires 510 comparators decoders, a DAC of 8 bits, and other supporting circuitry). As seen from the previous examples, as the resolution is increased, the development of single chip Half Flash ADC is faced with the same type development flaws incurred in achieving higher resolutions in Flash ADC's. Therefore this leaves a gap to develop new techniques to achieve a higher resolution with conversions rates comparably close to that of Flash or Half Flash ADC's.

SUMMARY AND OBJECTIVES OF THE INVENTION

With the above-mentioned prior art disadvantages it is the sole purpose of the present invention to provide a parallel ADC which is comparable in speed to that of a Flash ADC yet which can achieve its higher resolutions without the same complexity constraints posed on the Flash or Half Flash ADC's as reliant on current available technology and the hurdles which the development cycle must face.

Thus it is a prime objective of the present inventions to expand upon the resolution of current available Flash ADC technology. This is accomplished by an array of enhancing circuitry surrounding a Flash ADC to provide a higher resolution at relatively fast conversion rates. Hence this supporting circuitry and the Flash ADC together composes an ADC of the EADC (Expanded Analog to Digital Converter) type. The EADC is composed of the following circuitry;

A sample/holding circuit to temporarily hold the analog input at its sampled level;

An ADC composed of comparators and decoders to convert an analog signal into a digital approximation;

A reference selector to provide a means of selecting reference voltage/s (in place of using a reference voltage selector, a reference current selector may be used) for the comparators in the ADC to reference the analog input therein;

A reference source to provide the reference selector with voltages (or currents) to select from;

A digital to analog converter (DAC) to provide a subtraction voltage corresponding to the present total combined digital data resulting from the last conversion and previous conversions if any;

A subtracter to subtract the previous conversion voltages for the analog input level;

A number of latches to temporarily hold each conversion segment to make up a total of one word (word=number of bits of resolution);

A buffer to provide a means of allowing external circuitry to view the resulting word stored in the temporary latches;

Timing/control circuitry which provides a means of selecting the appropriate function at the proper time.

As one may determine from the composition of the EADC as described above, it can be seen that this particular design can achieve the desired results as for a unipolar operation. However to achieve these same outstanding results in a bipolar mode using the above structure requires the following conditions:

The DAC must be put into a bipolar mode;

The reference selector must supply the Flash ADC with both the plus and minus references, by using a reference selector combined with a bipolar reference generator which provides an equal positive and negative reference voltage (or current) source or by using two separate reference selectors, one for the positive and the other for the negative reference source. (This allows the EADC to be configured with equal or unequal +/−bits corresponding to the +/−references);

The latches must also be configured to latch the data of the ADC according to the reference values (i.e. if a Flash ADC of 4 bits is used and equal reference voltages are used, the latches must first latch the outer bits and work their way in word XX0000XX, in this example XX represents the value of the segment to be converted and 0000 represents the next segment to be converted);

The outputs of the latches must also be applied to the proper inputs of the DAC to provide the appropriate feedback voltage for subtraction.

Using the above technique the present invention works, however it is very inefficient. That is, an EADC of 8 bits using the above technique with equal value references (+/−values) will only give a +/− resolution of 4 bits, since it is impossible to have a plus and minus value at the same instant in time. Therefore it is one of the objectives of the present invention to provide a means of achieving a bipolar resolution without the side effect caused by using the bipolar references. This is achieved by using the configuration for the unipolar EADC with the addition of a signal/sign transposer circuit to provide a bipolar mode of operation. As an example of the improvements this makes, the same EADC with 8 bits and a equal bipolar reference having a +/− resolution of 4 bits (effective resolution of approximate 5 bits) would have a resolution of +/−8 bits for an effective resolution of 9 bits including the sign bit with a single/sign transposer and the unipolar EADC. (The ADC using the single/sign transposer and the unipolar EADC will be hereinafter referred to as a bipolar EADC)

All of the EADC's as employed provide a means of obtaining the desired higher resolutions with minimal complexity compared to that of the Flash or Half Flash ADC's, yet providing a comparable high conversion rate. In general the conversion rate of a EADC is equal to the (speed of the Flash ADC) divided by (desired resolution divided by the resolution of the Flash ADC).

BRIEF DESCRIPTION OF THE DRAWINGS

The preceding brief descriptions are the preferred embodiments which compose the present invention.

DETAILED DESCRIPTION OF THE INVENTION

Figure 1:
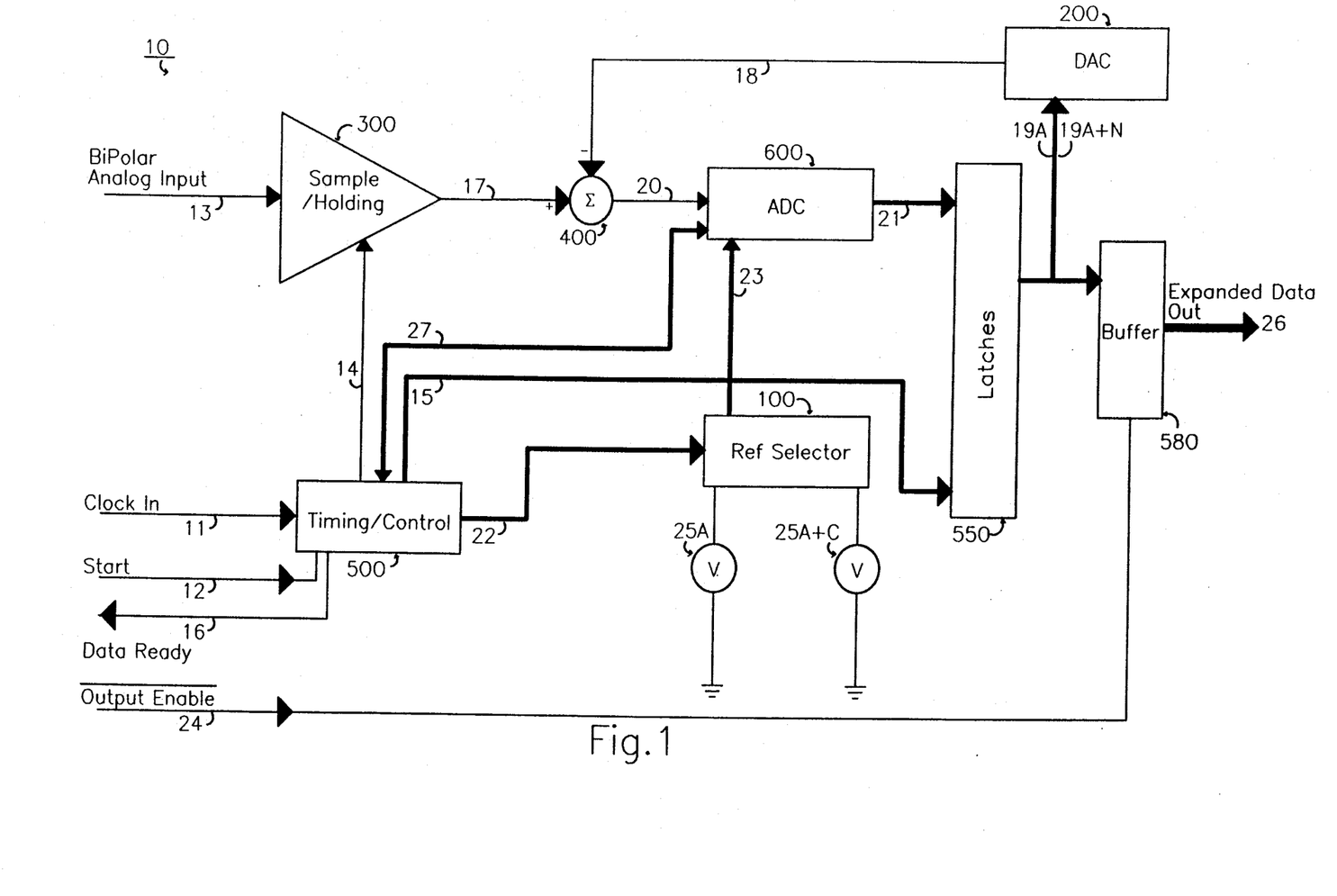
FIG. 1 illustrates a block diagram of a unipolar EADC in accordance with the present invention.

FIG. 1 shows a linear EADC (expanded analog to digital converter) 10 according to the present invention. FIG. 1 is a functional block diagram with single narrow lines representing a single interconnecting conductor, wide lines representing a single conductor or a multiplicity of conductors (bus), and arrows designating the direction the signals flow. The power supply connections are not shown in FIG. 1 to demonstrate the concept of operation without distractions. Note: In the following discussion of FIG. 1 the use of high and low is used just to illustrate the functionality of the circuit. These levels can be changed to represent the functions as desired. Also note previous resolution = total number of bits of the accumulated previous conversion segments (ie. if completed the third conversion segment and each conversion segment is 4 bits wide the total previous resolution = 3 segments * 4 bits = 12bits). Also observe that bus 23 indicates that one can use both +-− ADC reference (ref) inputs or a single ref input dependent to a sample a +/− range (for a single range connect one of the references to ground or a fixed voltage source and the other ref to reference selector 100).

In FIG. 1 a continuous pulsed signal is applied via conductor 11 to the clock input of timing/control circuit 500. This pulsed signal at conductor 11 has no effect on timing/control circuit 500 until there is a start pulse applied to timing/control circuit 500 via conductor 12. When the start pulse is applied, latches 550 are cleared to zero by one conductor in bus 15. This in turn causes the DAC 200 to output 0V on conductor 18 for a initial 0V subtraction voltage. Data ready signal via conductor 16 goes low, to tell the external circuitry that the data is not ready to be read yet, and at that same instant timing/control circuit 500 selects the default Ref voltage/s 25A (Vref/s were 25A = first voltage source/s) by using reference selector 100, via bus 22, and applies this new reference voltage/s to ADC 600 Ref input/s via bus 23. (Note: When talking about the reference source, the voltage and the Vref/s may be changed to current and Iref/s in the following specifications of FIG. 1 and FIG. 7.) When the start pulse on conductor 12 returns to its normal voltage level of operation, timing/control circuit 500 starts to count up in binary by using the clock pulses. This binary counting is used as a means of making events happen in sequence. The first event sends a control signal to sample/holding circuit 300, via conductor 14, to sample the analog signal at conductor 13 and to hold it constant at that sampled analog level, via output conductor 17, until the total conversion is completed. This analog level is applied to the positive side of subtracter 400 with a initial subtraction voltage of zero volts provided by DAC 200 via conductor 18. This was derived when latches 550 were reset and their outputs were applied to DAC 200 via Bus 19A (19A = first conversion segment, since N = 0 it is omitted) through 19A + N (19A + N = total number of conversion segments, the last segment however is not applied to DAC 200). The resulting voltage from subtracter 400 is then applied to the analog input of ADC 600 via conductor 20. This analog input is then converted into digital data corresponding to the voltage presented at the Vref/s of ADC 600 (default Vref/s of reference selector 100). Note: Bus 27 is an optional bus which is to be used by timing/control circuit 500 to provide control signals (i.e. Start of conversion Clk)

and to obtain control conditions (i.e. End of conversion) from and to different types of ADC's (i.e. Successive Approximation, Ramp, Flash) used as ADC 600. It is recommended however to use a Flash ADC to achieve the optimum performance that EADC 10 is designed to obtain.

The digital data is then presented to latches 550 on bus 21. Timing/control circuitry 500 then performs its second event which sends a control signal to the MSW (most significant word) latch to capture this digital data. This new data is then passed to the MSW of DAC 200 via bus 19A which results in a corresponding subtraction voltage via conductor 18. The third event timing-/control circuit 500 performs is to select a new reference voltage/s with reference selector 100 via bus 22. Reference selector 100 then outputs this new reference voltage/s to ADC 600 Vref input/s via bus 23. This new reference voltage/s (Vref' = Vref/$2^{Previous\ Resolution}$) will give ADC 600 a means of converting part of the remaining voltage after subtracter 400 subtracts the previous converted voltage of ADC 600 from the original sampled voltage level. Subtracter 400 outputs this new voltage to ADC 600 input via conductor 20, at which time ADC 600 converts this voltage into digital data, (approximate binary equivalent of analog input) which is output to the latches 550 via bus 21. Timing-/control circuit then performs its fourth event which is latching the new digital data into the next MSW latch. This latch in turn outputs the digital data to the next MSW of DAC 200 via bus 19A+N (were N=1), which results in a new subtraction voltage to subtract from the original analog voltage. Timing/control circuit 500 then performs its next event selecting the next reference voltage/s (Vref'' = Vref/$2^{Previous\ Resolution}$) with reference selector 100 via bus 22.

The process of selecting a new reference (ref voltage/s = 25A + C, were C = current conversion segment), converting an analog level to an approximated digital representation, latching the data, converting it back to an analog level, and subtracting the newly derived level from the original level is repeated continuously until the desired resolution (closest precise digital representation of the analog level) is reached. On the last segment which is latched, LSW (least significant word) the digital data is not applied to DAC 200 because there will not be a need to convert the remaining voltage to digital data since the desired resolution has been reached. Timing/control circuit 500 then outputs a high level via conductor 16 to indicate that the total conversion is completed and the data is ready to be read. At this same instant timing/control circuit 500 stops all activities (stops counting) and expects a start pulse to start a new conversion cycle. When this data is ready to be read a low level is applied to the output enable, via conductor 24 to buffer 580 to monitor the total resulting expanded binary data.

Figure 2:
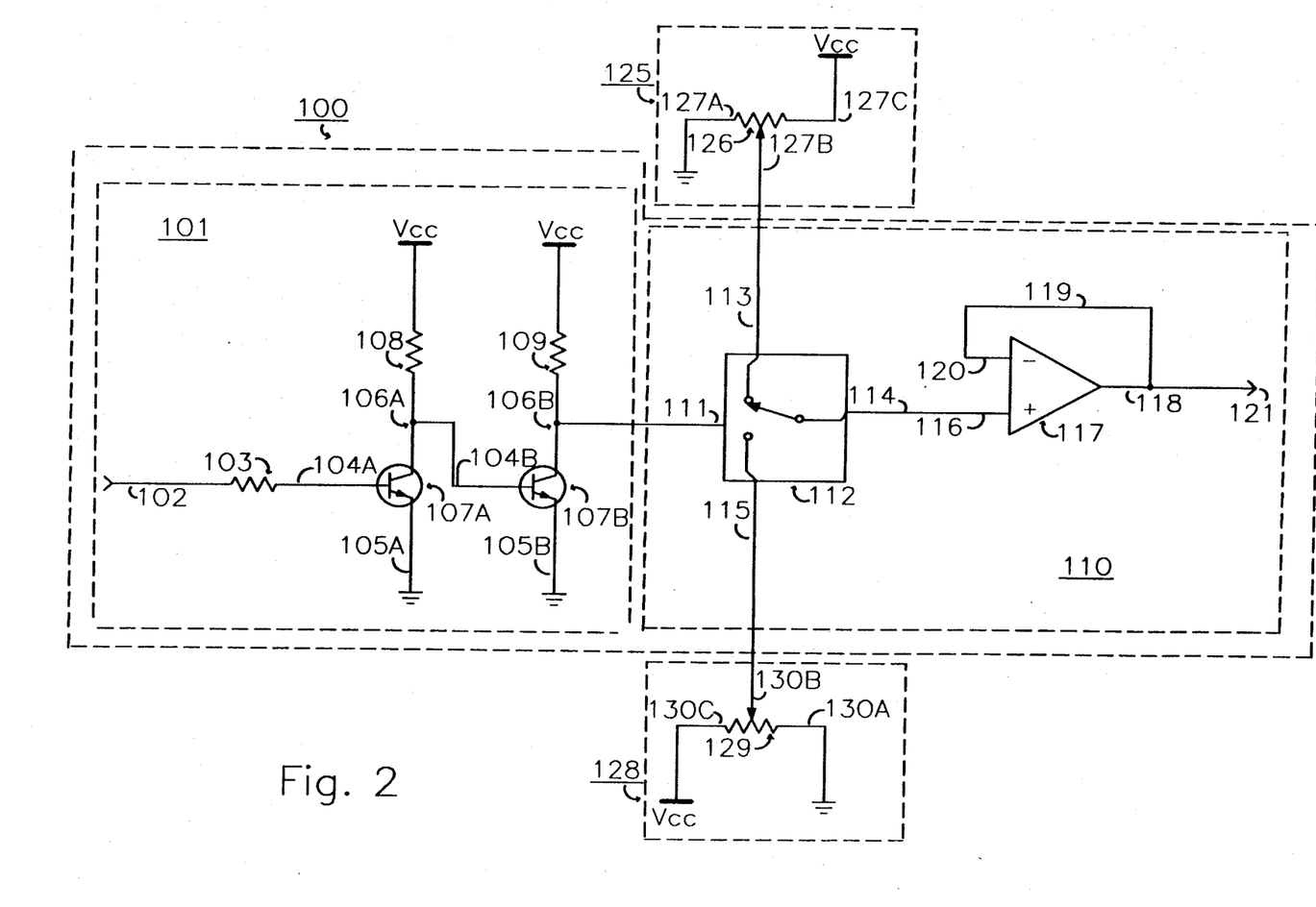
FIG. 2 shows a circuit schematic diagram of a unipolar reference selector as seen in FIG. 1 to provide the reference voltage.

FIG. 2 shows a particular embodiment of a means to select a reference source shown as reference selector 100 (also note voltage sources 125 and 128 can be used as voltage sources 25A and 25A+C accordingly) as illustrated by EADC 10 in FIG. 1. The purpose of reference selector 100 is to provide a means to change the voltage reference of ADC 600. This is achieved in FIG. 2 by two main sections 101 and 110 which together compose reference selector 100. Level translator 101 is used to translate the reference select control signal levels into corresponding levels which will insure reference switch 112 to switch fully to its proper state. Reference switch 112 of circuit 110 does the actual switching of the analog reference with respect to the switching level of the level translator 101. The output of switch 112 is then connected to a voltage follower which passes the voltage to an ADC Ref input and prevents the Ref voltage from being loaded down.

In FIG. 2, a digital TTL timing signal (reference select) is connected through conductor 102, which passes through limiting resistor 103. This provides enough current to the base 104A of transistor 107A to control its switching state. When the reference select timing signal is low, transistor 107A is off. The result is resistor 108 pulls up the voltage level at collector 106A, which in turn provides enough current to the base 104B of transistor 107B to put transistor 107B into saturation, thereby the voltage at collector 106B is pulled low through transistor 107B via collector 106B to emitter 105B to ground. When the reference select timing signal is high, transistor 107A is saturated and the output at collector 106A is low, the voltage at base 104B is low causing transistor 107B to be off, resulting in collector 106B being pulled high through resistor 109 to Vcc.

When the level translator 101 outputs a low to select position via conductor 111 as shown in FIG. 2, reference selector switch 112 switches to Vref at conductor 113 to the output point 114. Reference voltage along conductor 113 is derived from potentiometer 126 with one end tied to ground 127A, the other end at a voltage level 127C, and wiper 127B moved to a position that provides the desired voltage reference source (Vref) 125. When level translator 101 outputs a high to select position via conductor 111, reference selector switch 112 switches to Vref' at conductor 115 to output point 114. Reference voltage' along conductor 115 is derived from potentiometer 129 with one end tied to ground 130A, the other end at voltage level 130C, and the wiper 130B, which is moved to a position that yields the desired voltage reference' source (Vref' = Vref/$2^{Previous\ Resolution}$)128. (Note: Power connections Vcc, Gnd, +V, and −V of the switch and op-amps are omitted in the interest of simplicity.)

Output 114 of switch 112 is connected to noninverting input 116 of op-amp 117. The output 118 of op-amp 117 is feedback via conductor 119 to inverting input 120. This puts op-amp 117 into a voltage follower configuration, thus preventing any unwanted loading down of output 114 of switch 112. Output 118 of the op-amp 117 provides enough current and the proper voltage level (Derived by Vref 113 or Vref' 115) at output 118 via conductor 121 to drive ADC 600 at its proper level.

Figure 3:
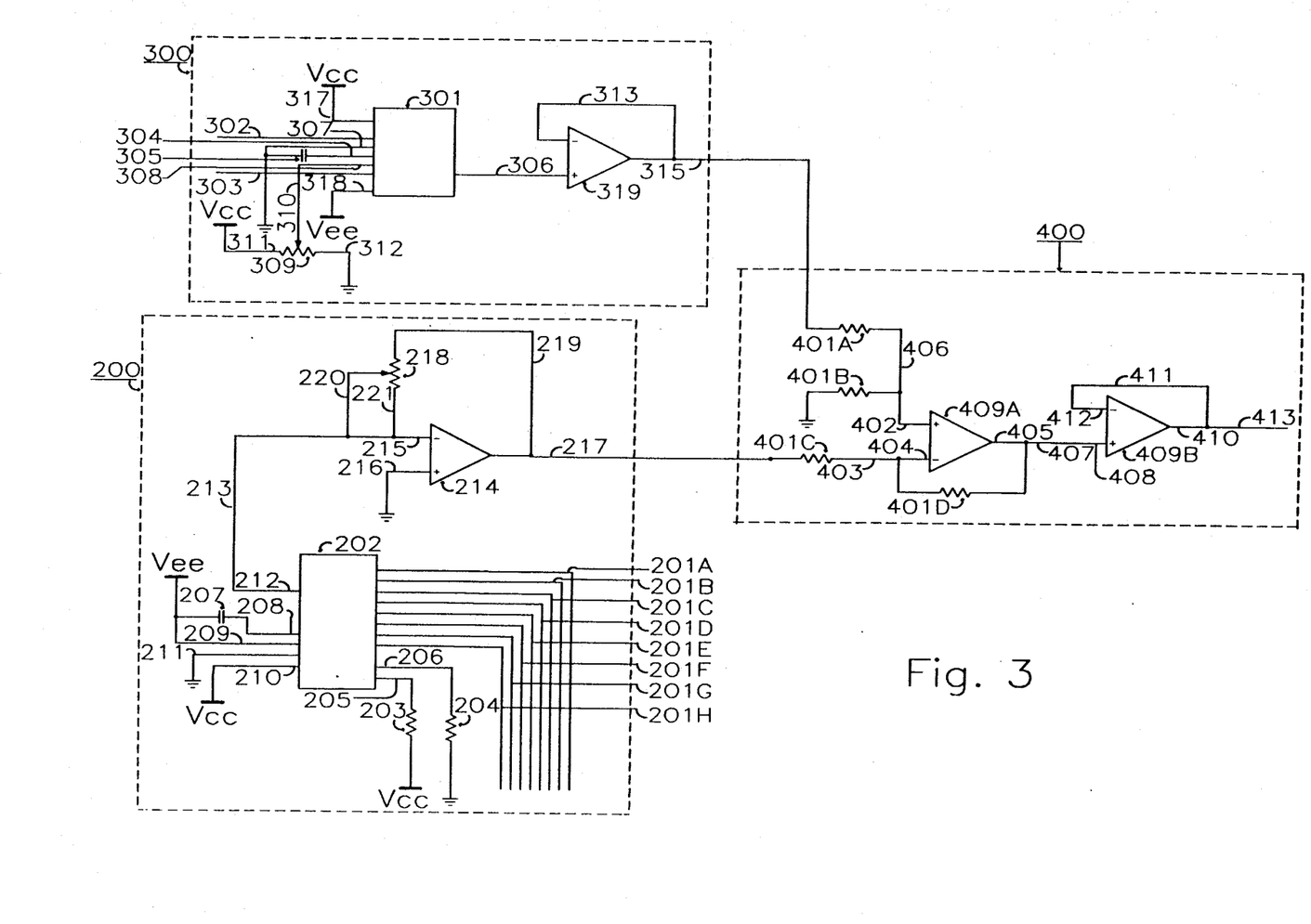
FIG. 3 demonstrates a schematic diagram of a sample/holding circuit, a digital to analog converter, and a subtracter as seen in FIG. 1.

FIG. 3 shows particular circuitry that consists of three main sections 200, 300, and 400 composing an analog subtraction feedback of an analog sample. Furthermore, each of these main sections can be used in FIG. 1. Sample/holding circuit 300 provides a way to hold an analog sample constant for the duration of the total conversion cycle. DAC circuit 200 provides a means of converting each quantified segment (ADC digital data) into its corresponding analog voltage level. The voltage level from the sample/holding circuit 300 is subtracted by the voltage of the analog feedback circuit DAC 200 (initial state 0 V). Hence, subtracter circuit 400 provides this function of subtraction and a way to prevent the resulting voltage from being loaded down by external circuitry. (Note: +V and −V are analog power supply connections for the op-amps and have been omitted in the interest of simplicity.)

In FIG. 3, a bus of parallel conductors 201A-201H (201A being MSB and 201H being LSB) provides digital data to be converted by DAC 202 into an analog signal. This is achieved by placing a reference voltage through resistor 203 to +Ref input 205 of DAC 202. This in turn supplies a reference current in conjunction with the internal circuitry of DAC 202. This current is then used as a current mirror for feeding the ladder within DAC 202. The —Ref input 206 of the DAC 202 is tied to one side of resistor 204 and the other side of resistor 204 is tied to ground. This way DAC 202 will have a unipolar current reference source. Note that resistor 203 and resistor 204 must be equal to maintain a stable output. Capacitor 207 is used in conjunction with DAC 202 compensation internal circuitry via conductor 208 and Vee. Note that capacitor 207 is directly proportional to resistors 203 and 204 and must be increased accordingly. DAC 202 is supplied by Vee via conductor 209, Vcc via conductor 210, and Gnd via conductor 211. Analog output current at conductor 212 of DAC 202 supplies a current through conductor 213 to op-amp 214 negative input 215. Positive input 216 of op-amp 214 is tied to ground to provide a zero volt offset at output 217.

This current is converted into voltage through op-amp 214 in conjunction with feedback potentiometer 218. The output of op-amp 214 is connected to one terminal of potentiometer 218 through conductor 219. The other terminal of potentiometer 218 is connected to conductor 213 via conductor 221 which is connected to wiper 220 of potentiometer 218. Pot 218 is used to control the size of each step made for the accumulative output voltage level 217 of DAC 202.

Sample/holding circuit 301 samples analog signal through conductor 303. A signal is sampled when the control logic sends a sample control pulse to sample/holding circuit 301 through conductor 302. This passes the analog signal from conductor 303 to conductor 304 where the analog signal is held by capacitor 305 at its precise peak for that instant in time. This held level is then passed inside the sample/holding circuit 301 through a voltage follower (not shown) to prevent external circuitry from discharging the capacitor. The output of this voltage follower is connected at conductor 306. Conductor 307 provides the reference at ground so the timing signal at conductor 302 only has to swing between ground and TTL logic high. Conductor 308 supplies sample/holding circuit 301 with an analog offset voltage at conductor 306. This offset voltage is supplied by potentiometer 309 which swings between Vcc terminal 311 and ground terminal 312 by wiper 310 connected to conductor 308. The power for sample/holding circuit 301 is supplied by conductor 317 Vcc and conductor 318 Vee.

The output of sample/holding circuit 301 along conductor 306 is connected to the noninverting input of op-amp 319, which is configured in a voltage follower configuration, by feeding output conductor 315 of op-amp 319 to the inverting input via conductor 313. This provides a unity gain of 1. This output at conductor 315 is then passed on to resistor 401A. On the adjacent side of resistor 401A conductor 406 connects to resistor 401B which is tied to ground. This configuration reduces the output voltage at conductor 315 by half at conductor 406.

The output at conductor 406 is connected to the noninverting input 402 of op-amp 409A. Thus op-amp 409A provides a gain of 1 for the noninverting input 402 since the voltage at conductor 315 is divided by 2 and then multiplied by 2 thereby giving a total gain of 1. On op-amp 214 the final output conductor 217 is connected to resistor 401C. On the other side of resistor 401C, conductor 403 connects the inverting input 404 of op-amp 409A, and connects resistor 401D to output 405 of op-amp 409A. This provides a gain of —1 thus resulting in a subtraction voltage to subtract from the initial analog signal. Hence, (sample/holding sampled level/2*2)+(DAC subtraction level*(—1)) yields (sample/holding sampled level)—(DAC subtraction level). (Note: Op-amp 409A is configured as a subtracter since resistor 401A, 401B, 401C, 401D are of equal value.)

Output 405 of op-amp 409A is connected to noninverting input 408 via conductor 407 to op-amp 409B. Output 410 of op-amp 409B is connected to inverting input 412 via conductor 411. This configuration makes op-amp 409B into a voltage follower; this op-amp 409B provides an isolation between the final output 410 and the subtracter output 405. This prevents output 405 of op-amp 409A from being loaded down by the next preceding circuit. This final output 410 is then connected to an ADC input via conductor 413.

Figure 4:
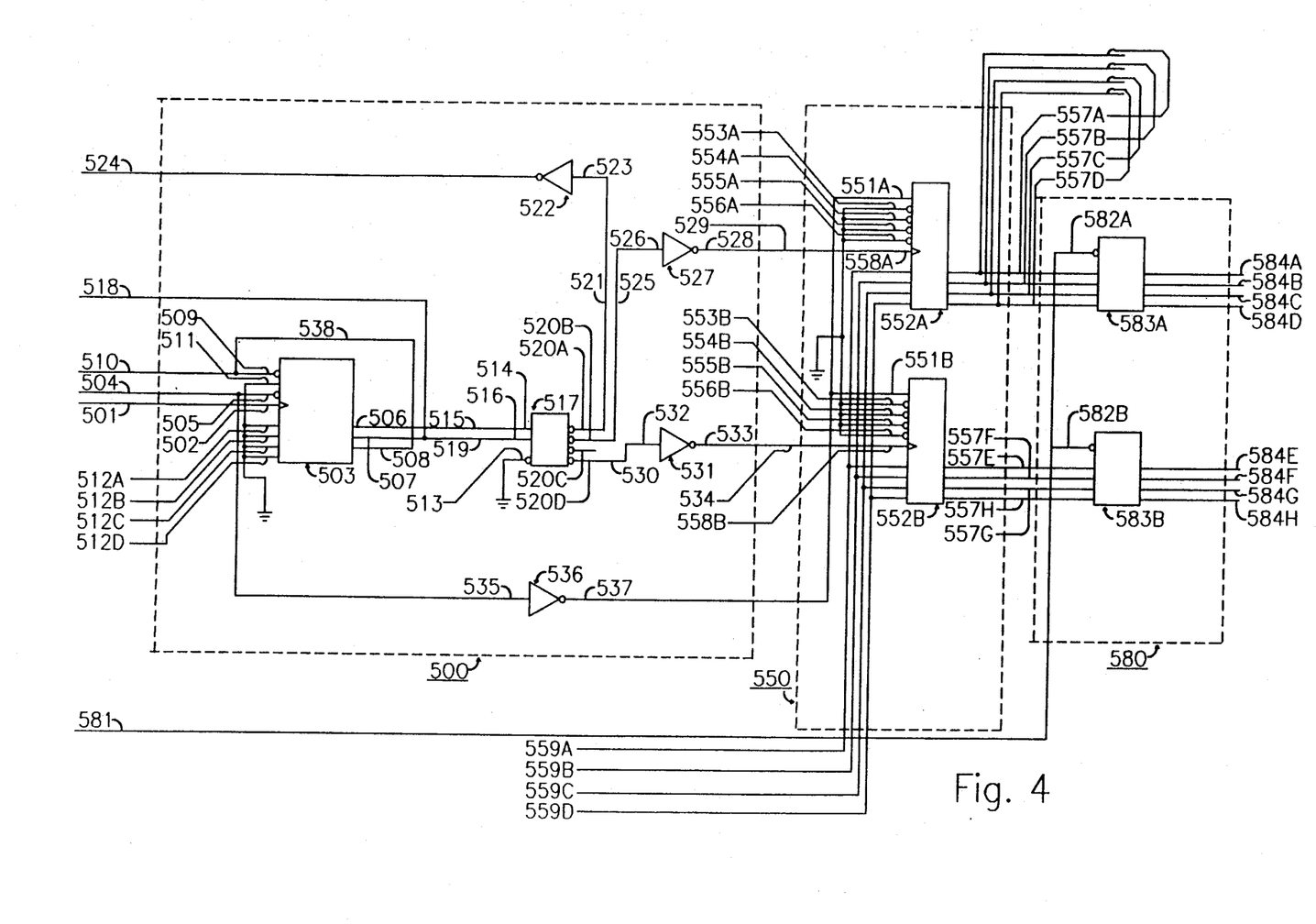
FIG. 4 depicts a schematic diagram of a timing/control circuit, latches, and buffers as seen in FIG. 1.

FIG. 4 shows an embodiment which consists of three main sections 500, 550, and 580 that compose all of the timing and control logic, as well as providing the latches and buffers. Furthermore each one of the sections 500, 550, and 580 can be used in FIG. 1. Timing-/control circuit 500 requires a continuous clock pulsed signal. A start pulse to initiate the counting process starts the analog conversion cycle and clears the latches, and an output enable signal to allow external circuitry to view the resulting digital data. Timing/control circuitry 500 provides a signal to sample/holding circuit 300 to sample and hold the analog signal at that precise instant and provides a means to select the reference voltage of ADC 600, and provides latching pulses to latch the ADC data segment into its corresponding latch. Latches circuit 550 provides a way to hold the resulting digital segments of ADC 600 until the total conversion is completed. When the conversion is complete, the external circuitry signals buffer circuit 580 to allow the total conversion data to be monitored by the external circuits. (Note: Power connections Vcc and Gnd are omitted in the interest of simplicity.)

In FIG. 4, a continuous external clock signal via conductor 501 is applied to clock input 502 of binary counter 503. Counter 503 is configured to count/up to provide appropriate timing signals for decoder 517 and for selecting an appropriate reference via conductor 518. However to make the binary counter 503 count an external start signal along conductor 504; going active low must be applied to reset input 505 of the binary counter 503. Once this start signal along conductor 504 returns high, binary counter 503 counts to four in binary using LSB (least significant bit) output 506 and MSVB (most significant valid bit) output 507. MSVB output 507 is responsible for selecting the appropriate reference voltage for ADC 600 via conductor 518. When counter 503 reaches binary 5 (100), output 508 stops counter 503 via conductor 538 to counter disable input 509. This output also tells the external circuitry that the sampled data it has just latched is ready to be read via conductor 510. (Note: up/down input select 511 is tied to ground to make the binary counter 503 count up. Also note inputs 512A, 512B, 512C, and 512D are tied to ground so that when counter 503 is reset the initial outputs 506, 507, and 508 will be set to zeroes.)

Binary decoder 517 is placed in a fixed (on) state by connecting gate enable input 513 to ground. Decoder 517 selects its corresponding output based upon its appropriate binary input LSB 514, connected via conductor 515 to counter LSB output 506. MSB input 516 of decoder 517 is connected via conductor 519 to binary counter MSVB output 507. When decoder 517 inputs MSB 516 and LSB 514 are both low (00), the corresponding output 520A is selected. The decoder output 520A is connected to inverter input 523 via conductor 521 which provides an active high output 524 at inverter 522. This in turn allows analog signals to pass through sample/holding circuit 300. When decoder 517 moves to the next sequence, the level which the analog signal is at is held constant by the sample/holding circuit 300 until the whole conversion is completed. When decoder 517 inputs MSB 516 is low (0) and LSB 514 is high (1) the corresponding active low output 520B is connected, via conductor 525 to input 526 of inverter 527. The output 528 of inverter 527 is then applied to a latch via conductor 529. When decoder 517 inputs MSB 516 is high (1) and LSB 514 is low (0), the corresponding active low output 520C is not used because a new reference is being selected at that moment in time. Thus this period is devoted to the reference voltage' stabilizing to insure the next conversion sequence to be accurate. When decoder 517 inputs MSB 516 is high (1) and LSB 514 is high (1) the corresponding active low output 520D is connected via conductor 530 to input 532 of inverter 531. The output 533 of the inverter 531 is then applied to a latch via conductor 534 to latch the data.

When a conversion is initiated by the start command via conductor 504, counter 503 is not the only part reset. Conductor 504 is connected to inverter 536 via conductor 535 to its input, and the output of inverter 536 is connected via conductor 537 to reset inputs 551A and 551B of latches 552A and 552B. This clears the latches to zero. This in turn sets the subtraction voltage back to zero volts derived from DAC 200 through conductors 557A, 557B, 557C, and 557D. When the signal from inverter 527 goes high, conductor 529 provides this pulse to clock input 558A of latch 552A. This pulse in turn latches the digital data from ADC 600 through conductors 559A, 559B, 559C, and 559D on the positive going edge into latch 552A for the most significant nibble (nibble=4 bits). This new digital data is presented to the outputs of latch 552A through conductors 557A, 557B, 557C, and 557D which in turn supplies DAC 600 with digital data that is converted into a new analog subtraction voltage which is to be used by the next conversion sequence. When the signal from inverter 531 goes high, conductor 534 provides this pulse to the clock input 558B of latch 552B. This pulse in turn latches the digital data from ADC 600 through conductors 559A, 559B, 559C, and 559D on the positive going edge into latch 552B for the least significant nibble. This new digital data is presented at the outputs of latch 552B through conductors 557E, 557F, 557G, and 557H. (Note: Input enables (553A, 553B, 554A, and 554B) and output enables (555A, 555B, 556A, 556B) are all tied to ground so that they are enabled all the time. This allows the DAC to see the outputs for a new subtraction voltage and provides a means to demonstrate a fully functional circuit.)

In buffer circuit 580 of FIG. 4 output enable control 581 allows external circuitry to monitor the total resulting analog to digital conversion. Output enable control input 581 must be low to enable buffers 582A and 582B to output the resulting data. When this condition is met, data from latches 551A and 551B, which is passed by conductors 557A through 557H to the inputs of buffers 583A and 583B, is passed to the outputs of these buffers to external circuitry through conductors 584A through conductors 584H.

Figure 5:
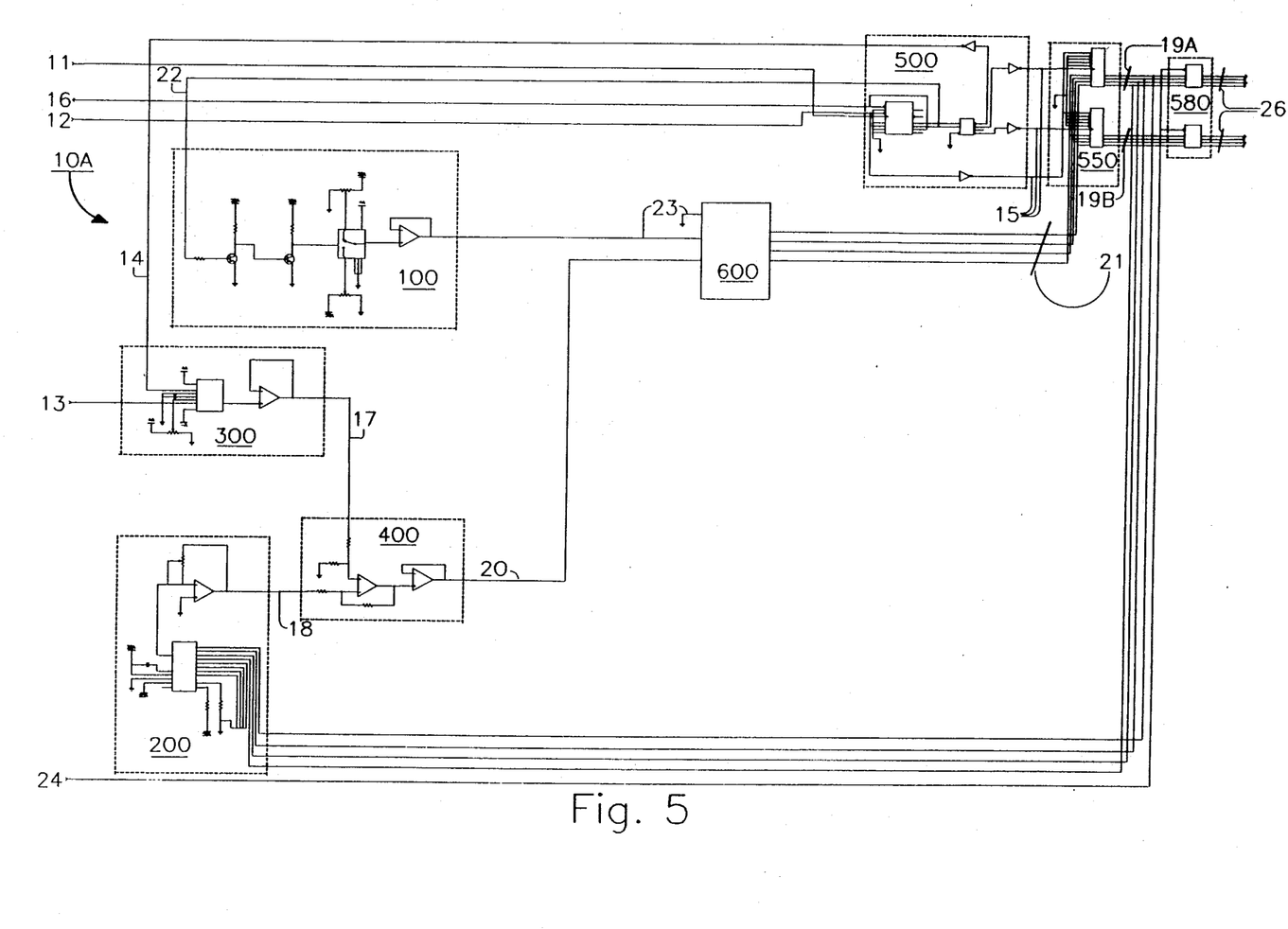
FIG. 5 pictures a circuit schematic of another embodiment of a reference selector which may be used in FIG. 1 to provide a bipolar reference source.

FIG. 5 illustrates fully functional unipolar linear EADC 10A as in employed in the present invention. Each of the previously discussed circuits in FIG. 2 through FIG. 4 are combined into one circuit which together composes FIG. 5 to demonstrate how the block diagram of FIG. 1 may be utilized to develop an EADC 10A.

Figure 6:
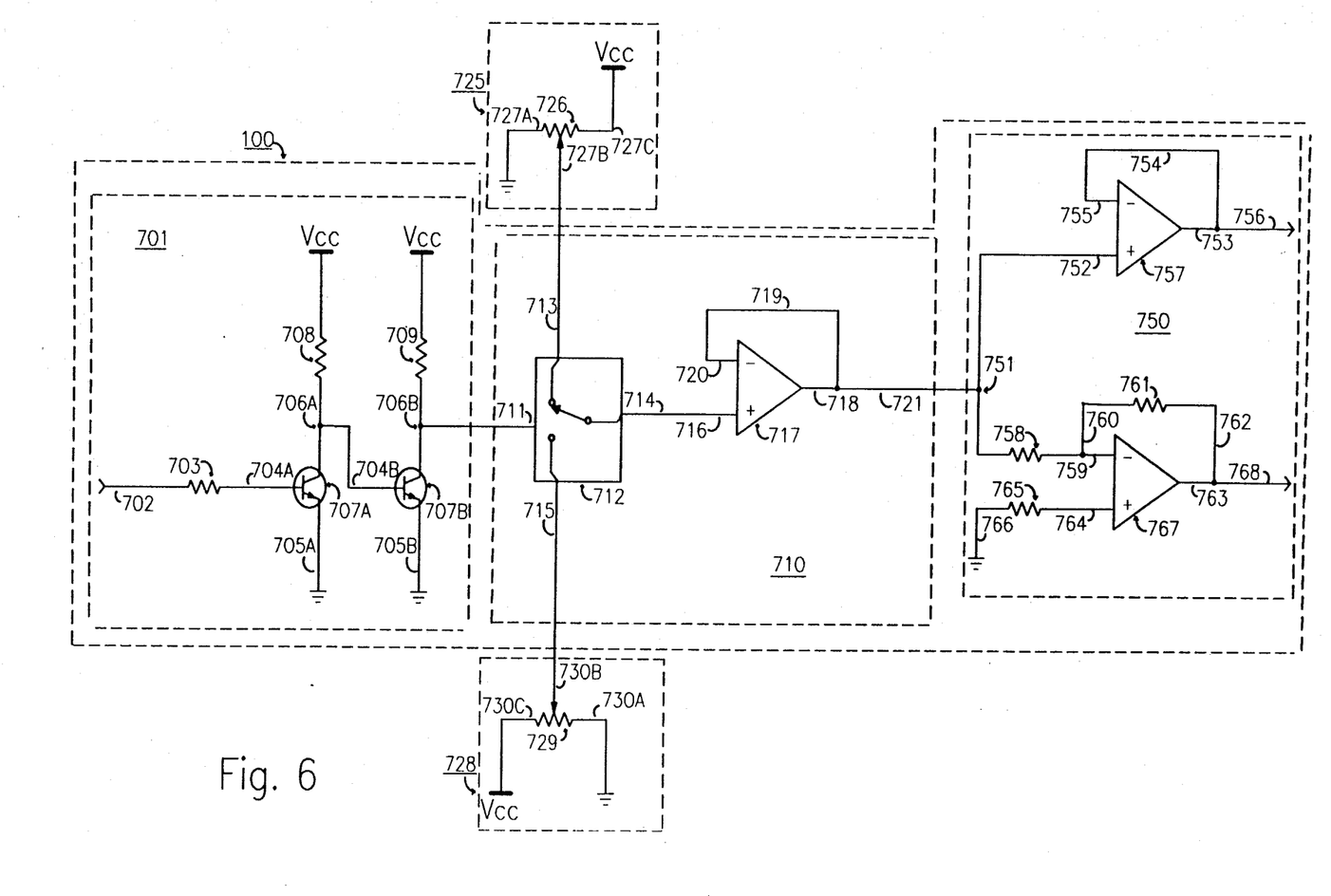
FIG. 6 features a detailed circuit schematic diagram of FIG. 1 using the previously described unipolar circuits (FIGS. 2–4) to form a fully functional unipolar EADC.

FIG. 6 shows one particular embodiment of a means to select a reference source shown as bipolar reference selector 100 which can be used in a bipolar mode (also note voltage sources 725 and 728 can be used as voltage sources 25A and 25A+C accordingly), as illustrated in the EADC diagram in FIG. 1. The purpose of reference selector 100 is to provide a means to change the voltage references of ADC 600. This is achieved in FIG. 6 by three main sections 701, 710, and 750 which compose reference selector 100. Level translator 701 is used to translate the reference select control signal levels into corresponding levels which will cause the reference switch 712 to switch fully to its proper state. The reference switching part of circuit 710 does the actual switching of the analog reference with respect to the switching level of level translator 701. The output of switch 712 is connected to voltage follower 717 (op-amp 717 is configured in voltage follower mode) which passes the voltage to a bipolar reference generator 750. Reference generator 750 then passes the reference voltage from the reference switch 710 to positive reference of ADC 600 (ref voltage is positive). At the same instant the reference voltage is passed to the positive ref of ADC 600 bipolar reference generator 750 also inverts this reference voltage and passes it to the negative reference input of ADC 600 (ref voltage is negative). The result is a equal positive and negative range of the same corresponding ref values for the ADC reference inputs. (Note: When the configuration as described in FIG. 6 is used, ADC 600 must have a resolution of two bits or greater otherwise the value you are comparing the input voltage to will always be zero volts (EADC will not expand the resolution properly). Another item to take into consideration is if, an odd number of bits is used, the center bit is always compared to a ref of zero volts. Therefore an even number of bits is suggested (when using an odd number of bits it is required that the center bit is discarded). You can achieve similar results by using two reference selectors, one for the positive ADC ref and one for the negative ref. This will provide a means of controlling the positive and negative range of ADC 600 separately. When using this type of bipolar conversion technique DAC 200 and corresponding latches 550 must also be set up in a bipolar mode.)

In FIG. 6, a digital TTL timing signal (reference select) is connected through conductor 702, this signal passes through limiting resistor 703 and provides enough current to base 704A of transistor 707A to control its switching state. When the reference select timing signal is low, transistor 707A is off. The result is resistor 708 pulls up the voltage level at collector 706A, which in turn provides enough current to base 704B of transistor 707B to put it into saturation, thereby the voltage at collector 706B is pulled low through transistor 707B via collector 706B to emitter 705B to ground. When the reference select timing signal is high, transistor 707A is saturated and the output at collector 706A is low, the voltage at base 704B is low causing transistor 707B to be off, resulting in collector 706B being pulled high through resistor 709 to Vcc.

When level translator 701 outputs a low signal to select position via conductor 711 reference selector switch 712 switches to Vref at conductor 713 to output point 714. Reference voltage along conductor 713 is derived from potentiometer 726 with one end tied to a ground 727A, the other end at a voltage level 727C, and the wiper 727B which is moved to a position that provides the desired voltage reference source (Vref) 725. When level translator 701 outputs a high signal to select position via conductor 711, reference selector switch 712 switches to Vref' at conductor 715 to output point 714. The reference voltage' along conductor 715 is derived from potentiometer 729 with one end tied to ground 730A, the other end at a voltage level 730C, and the wiper 730B, which is moved to a position that yield the desired voltage reference' source 728 (Vref'=-Vref/$2^{Previous\ Resolution}$). (Note: Power connections Vcc, Gnd, +V, and −V of the switch and op-amps are omitted in the interest of simplicity.)

Output conductor 714 of switch 712 is connected to noninverting input 716 of an op-amp 717. Output conductor 718 of op-amp 717 is feedback via conductor 719 to inverting input conductor 720. This puts op-amp 717 into a voltage follower configuration, thus preventing any unwanted loading down of the output conductor 714 of switch 712. Output conductor 718 of op-amp 717 provides enough current and the proper voltage level (derived by Vref 713 or Vref' 715) at output conductor 718 via conductor 721 to drive bipolar reference generator 750.

Bipolar reference generator 750 is connected via conductor 721 to conductor 751. Conductor 751 is then applied to input 752 of op-amp 757. Output along conductor 753 of op-amp 757 is fedback via conductor 754 to inverting input along conductor 755. Op-amp 757 in turn passes the reference voltage to the positive reference of ADC 600 via conductor 756. At the instant conductor 751 applies the reference voltage to input 752 of op-amp 757, conductor 751 also applies the reference voltage to one side of resistor 758. On the adjacent side of resistor 758, conductor 759 is applied to the inverting input of op-amp 767. Op-amp 767 then applies its output 763 to conductor 762 which passes the output signal through resistor 761 to conductor 760. Conductor 760 then passes this output signal back to the inverting input via conductor 759. This feedback loop will set the gain to −1 since resistor 758 and 761 are of the same value and the inverting input is being used as the input. The positive input of op-amp 767 is connected to conductor 764 to resistor 765 to ground via conductor 766. Resistor 765 is half the value of resistor 758 and resistor 761 to provide a zero volt offset at output conductor 763 of op-amp 767. Output along conductor 763 of op-amp 767 is then applied to the negative ref input of ADC 600 via conductor 768. These two op-amps 757 and 767 in turn will provide ADC 600 with an equal positive (conductor 756) to negative (conductor 768) reference range.

Figure 7:
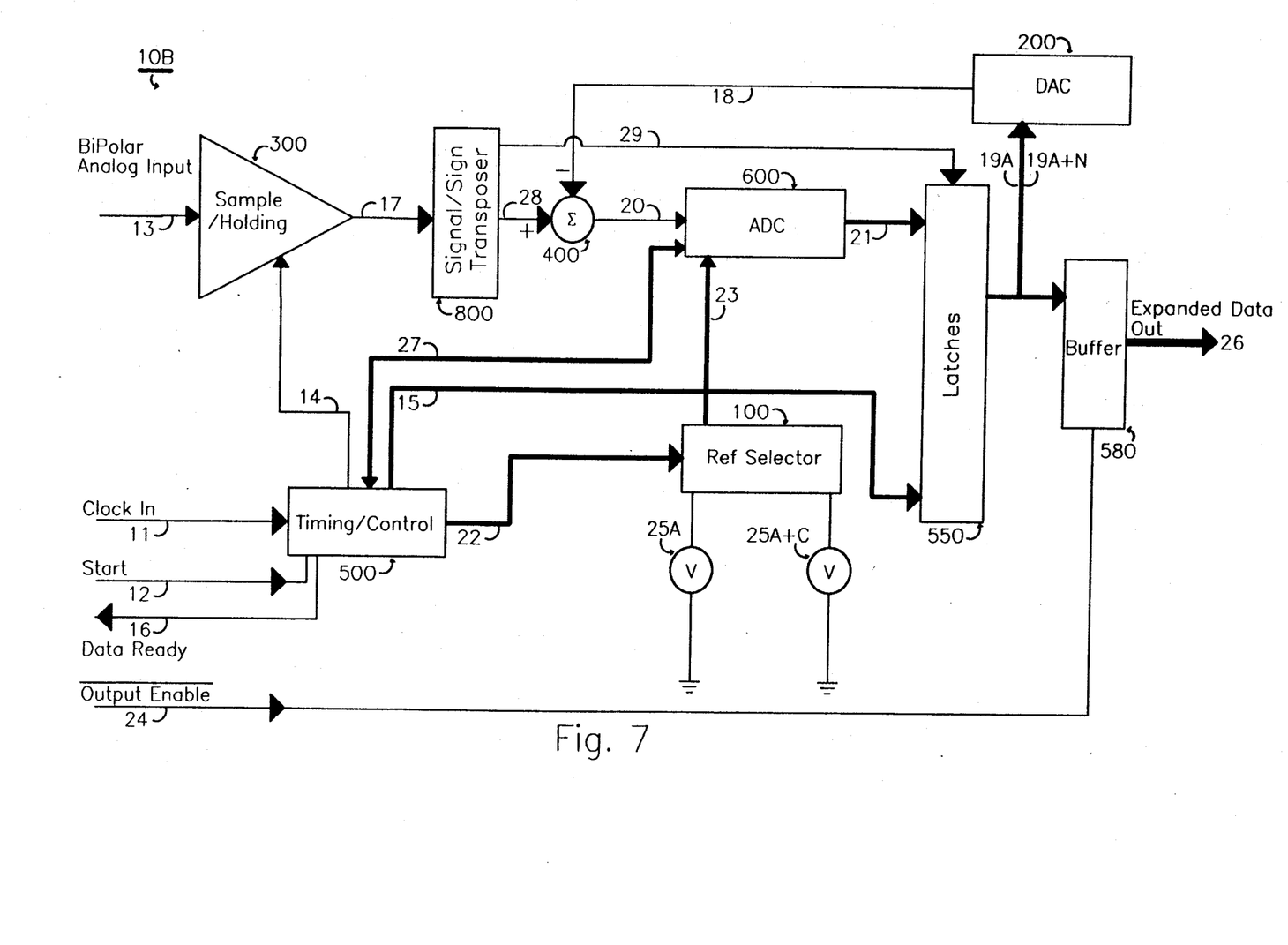
FIG. 7 illustrates a block diagram of a bipolar expanded analog to digital converter in accordance to the invention.

FIG. 7 shows a preferred embodiment of bipolar linear EADC 10B according to the present invention. It employs all of the previous circuits and technologies as discussed in FIG. 1 through 5 with the addition of signal/sign transposer 800 which will be discussed further regarding FIG. 8. FIG. 7 is a functional block diagram with its single narrow lines representing a single interconnecting conductor, wide lines representing a single conductor or a multiplicity of conductors (bus), and arrows designating the direction which the signals flow. The power supply connections are not shown in FIG. 7 to keep the circuit in its simplest form. (Note: In the following discussion of FIG. 7 the use of high and low is used just to illustrate the functionality of the circuit. These levels can be changed to represent the functions as desired. Also note previous resolution=total number of bits of the accumulated previous conversion segments (i.e. upon completion of the third conversion segment with each conversion segment 4 bits wide, the total previous resolution=3 segments * 4 bits=12 bits).)

Further, FIG. 7 a continuous pulsed signal is applied via conductor 11 to clock input of the timing/control circuit 500. This pulsed signal along conductor 11 has no effect on the timing/control circuit 500 until there is a start pulse applied to the timing/control circuit 500 via conductor 12. When the start pulse is applied, latches 550 are cleared to zero by one conductor in bus 15. This in turn causes the DAC 200 to output 0 V on conductor 18 for a initial 0 V subtraction voltage. Data ready signal via conductor 16 goes low, to tell the external circuitry (not shown) that data is not ready to be read yet, and at that same instant timing/control circuit 500 selects the default Ref voltage 25A (Vref were 25A=first voltage source) by using reference selector 100, via bus 22, and applies this new reference voltage to ADC 600 Ref input via bus 23. When the start pulse on conductor 12 returns to its normal voltage level of operation, the timing/control circuit 500 starts to count up in binary by using the clock pulses. This binary counting is used as a means of making events happen in sequence. The first event sends a control signal to the sample/holding circuit 300, via conductor 14, to sample the analog signal at conductor 13 and to hold it constant at that sampled analog level, conductor 17, until total conversion is completed. This analog level is applied to the input of the signal/sign transposer 800 which passes the level if it is positive or inverts it into a positive value if it is negative. This will enable ADC 600 to work in a unipolar mode providing bipolar quantized digital data. Signal/sign transposer 800 also generates a digital sign bit which is applied to the most significant bit of the MSW latch via conductor 29 (i.e. SDDDDDDDD, S=sign bit, D=coresponding digital data). This sign bit in turn tells external circuitry whether the corresponding quantized digital data in the latches is positive or negative (i.e. 1=positive and 0=negative). At the analog output 28 of the signal/sign transposer 800 the resulting positive analog level is applied to the positive side of subtracter 400 with an initial subtraction voltage of zero volts provided by DAC 200 via conductor 18. This was derived when latches 550 were reset and their outputs were applied to DAC 200 via bus 19A (19A=-first conversion segment, since N=0 it is omitted) through 19A+N (19A+N=total number of conversion segments, the last segment however is not applied to DAC 200). The resulting voltage from subtracter 400 is then applied to the analog input of ADC 600 via conductor 20. This analog input is then converted into digital data corresponding to the voltage presented at the Vref of ADC 600 (default Vref of reference selector 100). (Note: The sign bit is not applied to DAC 200 since it only supplies information on the polarity of the quantized analog level. Bus 27 is an optional bus which is to be used by the Timing/control circuit 500 to provide control signals (i.e. Start of conversion Clk) and to obtain control conditions (i.e. End of conversion) from and to different types of ADC's (i.e. Successive Approximation, Ramp, Flash) used as ADC 600.) It is recommend however to use a Flash ADC to achieve the optimum performance that the EADC 10B is designed to obtain.

Digital data is then presented to latches 550 on bus 21. Timing/control circuitry 500 then performs its second event which sends a control signal to the MSW (most significant word) latch to capture this digital data. This new data is then passed to the MSW of DAC 200 via bus 19A which results in a corresponding subtraction voltage via conductor 18. The third even timing/control circuit 500 performs is to select a new reference voltage with reference selector 100 via bus 22. Reference selector 100 then outputs this new reference voltage to ADC 600 Vref input via bus 23. This new reference voltage (Vref' = Vref/$2^{Previous\ Resolution}$) will give ADC 600 a means of converting part of the remaining voltage after subtracter 400 subtracts the previous converted voltage of ADC 600 from the original sampled voltage level. Subtracter 400 outputs this new voltage to ADC 600 analog input via conductor 20, then ADC 600 converts this voltage into digital data, (approximate binary equivalent of analog input) which is output to latches 550 via bus 21. Timing/control circuit 500 then performs its fourth event which is latching the new digital data into the next MSW latch. This latch in turn outputs the digital data to the next MSW of DAC 200 via bus 19A+N (were N=1), which results in a new subtraction voltage to subtract from the original analog voltage. Timing/control circuit 500 then performs the next event selecting the next reference voltage (Vref'' = Vref/$2^{Previous\ Resolution}$) with reference selector 100 via bus 22.

The process of selecting a new reference (ref voltage = 25A + C, were C = current conversion segment), converting an analog level to an approximated digital representation, latching the data, converting it back to an analog level, and subtracting the newly derived level from the original level is repeated continuously until the desired resolution (closest precise digital representation of the analog level) is reached. On the last segment which is latched, LSW (least significant word), the digital data is not applied to the DAC 200 because there will not be a need to convert the remaining voltage to digital data since the desired resolution has been reached. Timing/control circuit 500 then outputs a high level via conductor 16 to indicate that the total conversion is completed and the data is ready to be read. At this same instant timing/control circuit 500 stops all activities (stops counting) and expects a start pulse to start a new conversion cycle. When this data is ready to be read you must apply a low level to the output enable, via conductor 24 to buffer 580 to view the total resulting expanded binary data.

Figure 8:
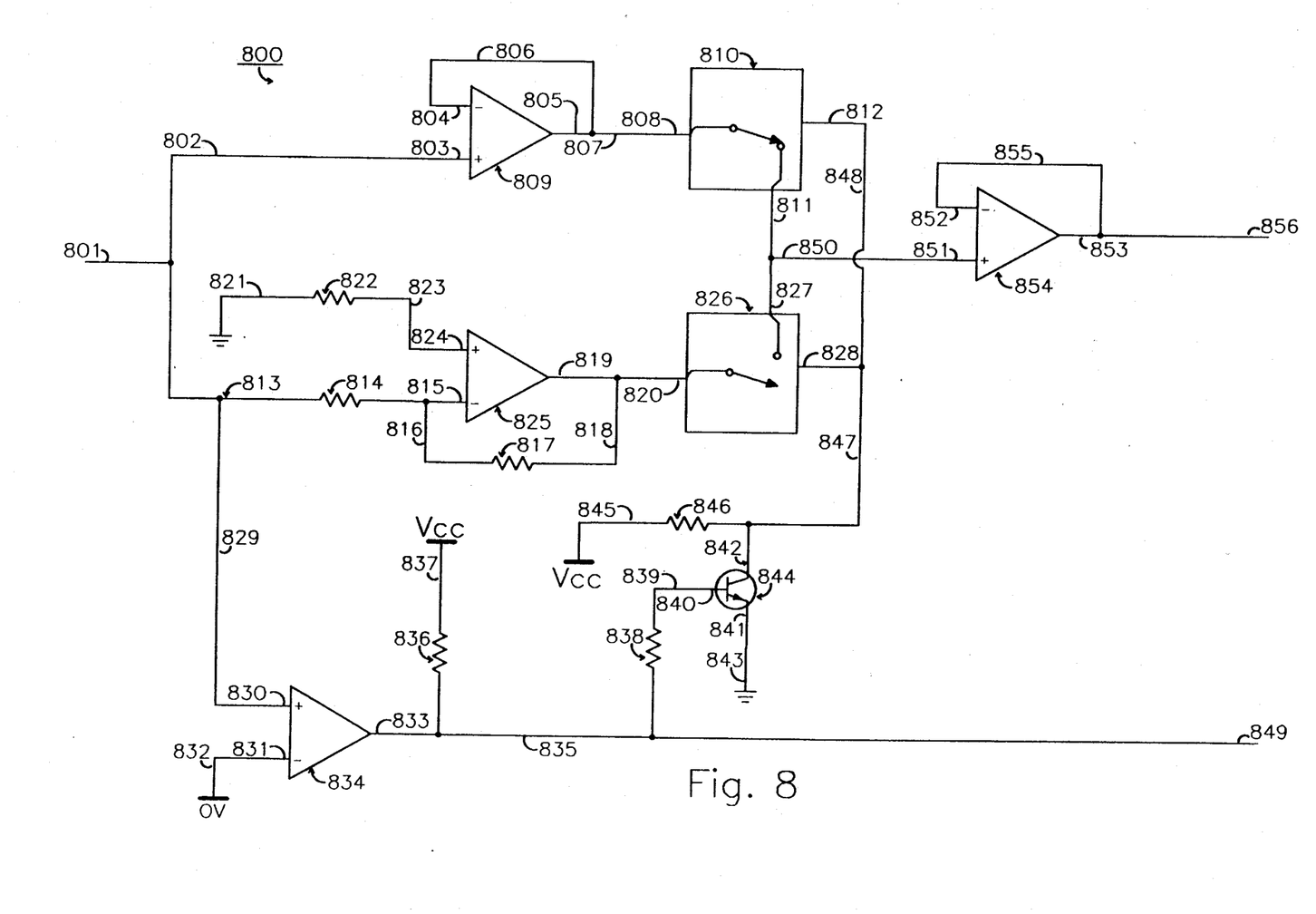
FIG. 8 shows a circuit schematic of signal/sign transposer that can be used in FIG. 7.

FIG. 8 shows one particular embodiment of a signal/sign transposer 800 which can be used as shown in the EADC 10B in FIG. 7. The purpose of signal/sign transposer 800 is to provide a means of translating a bipolar analog level into a equivalent unipolar analog level and to provide a binary bit which represents the polarity of the bipolar analog level at its input 801. This is achieved in FIG. 8 by comparing the analog level to zero volts. If the level is positive the analog level is passed to the output of signal/sign transposer 800. If the level is negative it is inverted to a positive value and then passed to the output of signal/sign transposer 800. The result of the look ahead comparator 834 does not just control the corresponding analog output level along conductor 856, it also provides the sign bit. (Note: The power connections (+V, −V, Vcc, and Gnd) to the switches, op-amps, and comparator are omitted in the interest of simplicity.)

In FIG. 8, a bipolar analog level signal is applied to input 801 which is carried by conductors 802, 813 and 829. Conductor 802 is connected to positive input 803 of op-amp 809. Output 805 is connected to inverting input 804 via conductor 806 which puts op-amp 809 into a voltage follower configuration isolating its input from its output. Output 805 of op-amp 809 is connected to switch input 808 via conductor 807. Conductor 813 is connected to resistor 814 which is connected to the inverting input 815 and to resistor 817 via conductor 816. The adjacent side of resistor 817 is connected to the output 819 via conductor 818, and resistor 814 makes op-amp 825 have a gain of 1 (since resistor 814 is of equal value). Positive input 824 of op-amp 825 is connected to one side of resistor 822 via conductor 823. The other side of resistor 822 is connected to ground via conductor 821, which provides an offset of zero volts. Resulting output 819 of op-amp 825 is equal to the analog level at input 801 times negative 1, this level is then applied to the switch input 820. Conductor 813 is also connected to conductor 829 which is connected to the positive input 830 of comparator 834. Look ahead comparator 834 compares this analog level with the level at negative input 831 via conductor 832 to 0V reference.

When the analog level is positive, comparator 834 output 833 is pulled high by resistor 836 via conductor 837 to Vcc. Output 833 is connected to conductor 835 which is connected to sign output 849 which provides the polarity (i.e. sign bit is positive = 1) of the analog level at input 801. Conductor 835 also applies this high state to resistor 838 which is connected to base 840 of transistor 844 via conductor 839. Transistor 844 pulls the high level provided by resistor 846 via conductor 845 to Vcc low at collector 842 of transistor 844 via emitter 841 to ground via conductor 843 (since the transistor is in the on state). This low level is then applied to the input switch select 828 of switch 826 via conductor 847 and to input switch select 812 of switch 810 via conductor 848. This disables switch 826 and enables switch 810 to pass the positive level at the switches input 808 to its output 811. Output 811 is then applied to the positive input 851 of op-amp 854 via conductor 850. Op-amp 854 is configured as a voltage follower by passing its output 853 to its inverting input 852 via conductor 855, thus isolating its input 851 from its output 853 which is connected to other circuits via conductor 856.

When the analog level is negative comparator 834 output 833 makes the sign level go low. Output 833 is connected to conductor 835 which is connected to the sign output 849 which provides the polarity (i.e. sign bit is negative = 0) of the analog level at input 801. Conductor 835 also applies this low state to resistor 838 which is connected to base 840 of transistor 844 via conductor 839. Transistor 844 is then in the off state thus resistor 846 pulls the level at collector 842 high through resistor 846 via conductor 845 to Vcc. This high level is then applied to the input switch select 828 of switch 826 via conductor 847 and to the input switch select 812 of switch 810 via conductor 848. This disables switch 810 and enables switch 826 to pass the positive level at switches input 820 to its output 827. This output is then applied to positive input 851 of op-amp 854 via conductor 850. Op-amp 854 is configured as a voltage follower by passing its output 853 to its inverting input 852 via conductor 855, thus isolating its input 851 from its output 853 which is connected to other circuits via conductor 856.

Figure 9:
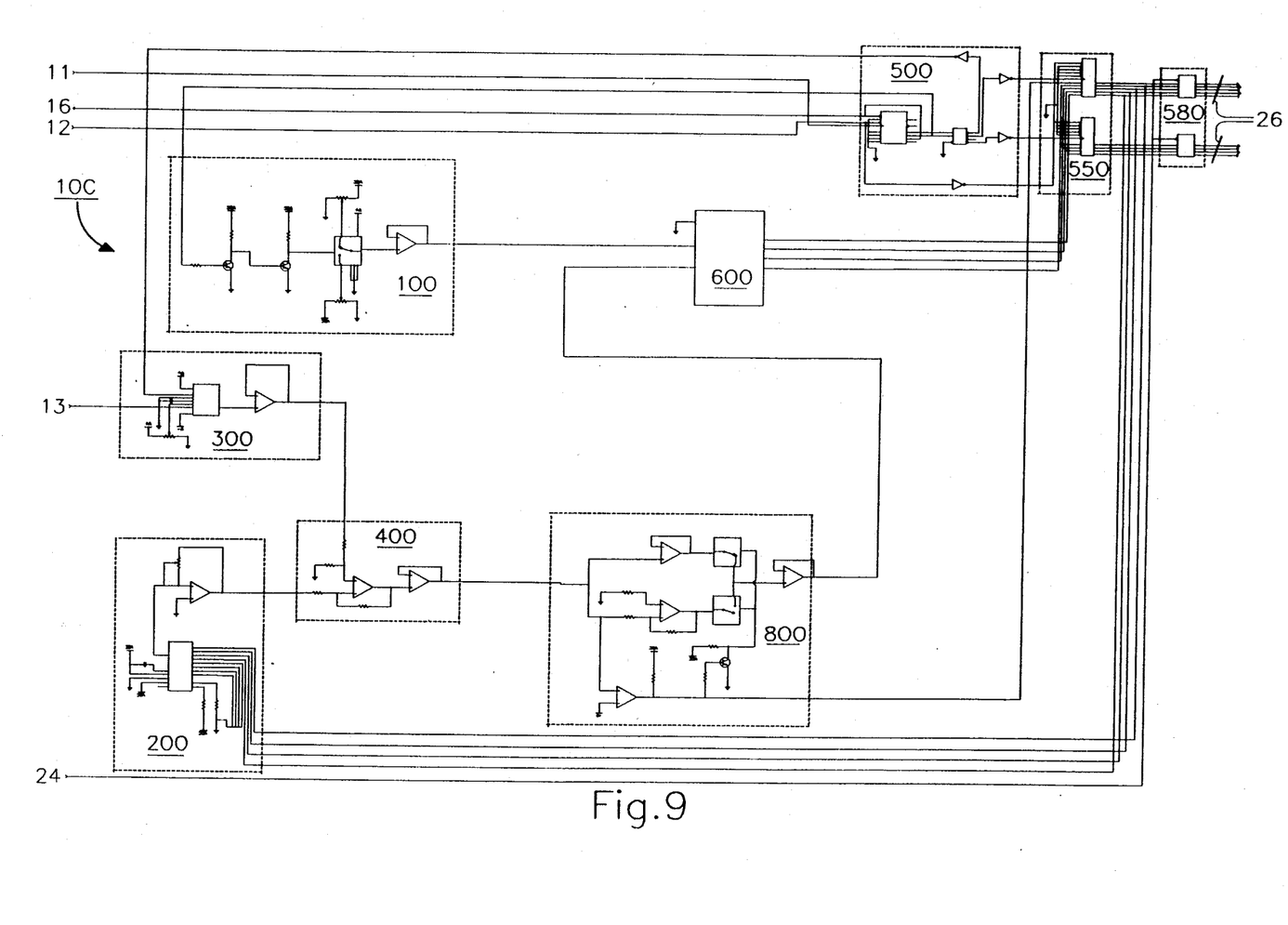
FIG. 9 demonstrates a detailed schematic diagram of FIG. 7 using all of the previously described unipolar circuits (FIG. 2–FIG. 4) and a bipolar signal/sign transposer circuit of FIG. 8 to depict how the circuits are interconnected as in FIG. 7 to form a fully functional bipolar EADC.

FIG. 9 pictures a fully functional bipolar linear EADC 10C as employed in the present invention. Each of the previously discussed circuits in FIG. 2 through FIG. 4 and FIG. 8 are combined into one circuit which together composes FIG. 9 to demonstrate how the block diagram of FIG. 7 may be utilized to develop a bipolar EADC.

I claim:

1. An analog to digital signal converter comprising: means for sample/holding an analog signal, a means for supplying a subtraction voltage, said sample/holding means connected to said voltage subtraction means, means to first convert an analog signal to digital approximations, said voltage subtraction means connected to said first converting means, a means to select reference sources, said selecting means connected to said first converting means, a reference source, said selecting means connected to said reference source, means to hold words, means to allow held words to be monitored, said word holding means connected to said first converting means and to said allowing means, a means to convert digital approximations to analog signals, said digital converting means connected to said voltage subtraction means, means to control operation sequence, said control means connected to: (a) said sample/holding means, (b) said selecting means, and (c) said word holding means, means to transpose a signal, said signal transposing means comprising a means for supplying a sign bit, said signal transposing means connected to said sample/holding means, said signal transposing means comprises a means to compare signals, a means to invert signals, a means to switch signals, and said comparing means and said inverting means connected to said switch means.

2. An analog to digital signal converter as claimed in claim 1 wherein said sample/holding means comprises a sample/holding circuit, a capacitor, said capacitor joined to said sample/holding circuit.

3. An analog to digital signal converter as claimed in claim 2 and including a means to supply offset voltage, said offset voltage supply means connected to said sample/holding circuit.

4. An analog to digital signal converter as claimed in claim 1 wherein said first converting means comprises a comparator and a decoder.

5. An analog to digital signal converter as claimed in claim 1 and including means to preserve signal integrity, said preserving means connected to said switch means.

6. An analog to digital signal converter as claimed in claim 5 and including a means to insure full closure of said switch means, said insuring means connected to said switch means.

7. An analog to digital signal converter as claimed in claim 1 wherein said selecting means comprises a reference switch.

8. An analog to digital signal converter as claimed in claim 1 wherein said means for supplying a subtraction voltage comprises an op-amp.

9. An analog to digital signal converter as claimed in claim 1 wherein said word holding means comprises word holding circuitry.

10. An analog to digital signal converter as claimed in claim 1 wherein said allowing means comprises a buffer.

11. An analog to digital signal converter as claimed in claim 1 wherein said control means comprises a counter.

12. An analog to digital signal converter as claimed in claim 1 wherein said control means comprises a binary counter.

13. A rapid high resolution analog to digital signal converter comprising: means for sample/holding an analog signal, said sample/holding means comprises a sample holding circuit, a means to supply offset voltage, said offset voltage supply means connected to said sample/holding circuit, a means for supplying a subtraction voltage, said sample/holding means connected to said voltage subtraction means, means to first convert an analog signal to digital approximations, said voltage subtraction means connected to said first converting means, a means to select reference sources, said selecting means connected to said first converting means, a reference source, said selecting means connected to said reference source, means to hold words, means to allow held words to be monitored, said word holding means connected to said first converting means and to said allowing means, means to control operation sequence, said control means connected to: (a) said sample/holding means, (b) said selecting means, and (c) said word holding means, a means to convert digital approximations to analog signals, said digital converting means connected to said voltage subtraction means, means to transpose a signal, said signal transposing means comprising a means for supplying a sign bit, said signal transposing means connected to said sample/holding means, said signal transposing means comprises a means to compare signals, a means to invert signals, a means to switch signals, and said comparing means and said inverting means connected to said switch means.

14. A method for converting analog signals to digital data in electrical circuitry, said circuitry including sample holding circuitry, signal/sign transposing circuitry, voltage subtraction circuitry, a digital to analog converter, an analog to digital converter, latches circuitry, and a reference selector, comprising the steps of:

(a) clearing the latches;
(b) sampling and holding an analog signal;
(c) holding the sampled signal constant;
(d) comparing the sampled signal to a predetermined voltage;
(e) inverting any sampled signal which is lower than said predetermined voltage;
(f) subtracting a voltage from said held signal;
(g) converting the resulting signal to a digital approximation;
(h) holding the digital approximation in latches circuitry;
(i) applying the digital approximation to a buffer while also applying the digital approximation to a digital to analog converter to provide a subtraction voltage;
(j) selecting a reference voltage while said digital to analog converter is converting the digital approximations to an analog subtraction level;
(k) repeating the steps (f)-(h) until a desired digital signal resolution is reached.

15. The method of claim 14, and including the step of providing a time period to stabilize the reference selector and digital to analog converter.

* * * * *